United States Patent
Miyashita

(10) Patent No.: US 8,878,715 B2
(45) Date of Patent: Nov. 4, 2014

(54) TIME-TO-DIGITAL CONVERTING CIRCUIT AND DIGITAL-TO-TIME CONVERTING CIRCUIT

(71) Applicant: Kabushiki Kaisha Toshiba, Tokyo (JP)

(72) Inventor: Daisuke Miyashita, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/776,371

(22) Filed: Feb. 25, 2013

(65) Prior Publication Data

US 2014/0055296 A1 Feb. 27, 2014

(30) Foreign Application Priority Data

Aug. 24, 2012 (JP) ................... 2012-185439

(51) Int. Cl.
| | | |
|---|---|---|
| *H03M 1/50* | (2006.01) | |
| *G04F 10/00* | (2006.01) | |
| *H03M 1/82* | (2006.01) | |
| *G06F 1/025* | (2006.01) | |

(52) U.S. Cl.
CPC ............... *H03M 1/50* (2013.01); *G04F 10/005* (2013.01); *H03M 1/822* (2013.01); *G06F 1/025* (2013.01)
USPC .......................................... 341/166; 341/155

(58) Field of Classification Search
USPC .................................. 341/118, 120, 155, 166
See application file for complete search history.

(56) References Cited

U.S. PATENT DOCUMENTS

| | | | | |
|---|---|---|---|---|
| 7,205,924 B2* | 4/2007 | Vemulapalli et al. | ......... | 341/166 |
| 7,843,374 B2* | 11/2010 | Kojima | ......... | 341/160 |
| 7,884,751 B2 | 2/2011 | Shimizu et al. | | |
| 7,888,973 B1* | 2/2011 | Rezzi et al. | ......... | 327/105 |
| 8,193,963 B2* | 6/2012 | Wang et al. | ......... | 341/166 |
| 8,228,106 B2* | 7/2012 | Baumann et al. | ......... | 327/278 |

FOREIGN PATENT DOCUMENTS

| | | |
|---|---|---|
| JP | 6-022318 B2 | 3/1994 |
| JP | 11-214967 A | 8/1999 |
| JP | 2008-028752 A | 2/2008 |
| JP | 2008-160594 A | 7/2008 |
| JP | 2009-218729 A | 9/2009 |
| JP | 2011-045006 A | 3/2011 |
| JP | 2011-259208 A | 12/2011 |

* cited by examiner

*Primary Examiner* — Brian Young
(74) *Attorney, Agent, or Firm* — Holtz, Holtz, Goodman & Chick PC

(57) ABSTRACT

A time-to-digital converting circuit includes a first flip-flop and a second flip-flop. The time-to-digital converting circuit a first delay controlling circuit that outputs a first data signal obtained by controlling a delay time of the reference data signal input thereto via the first signal input terminal based on the first output signal and a first clock signal obtained by controlling a delay time of the reference clock signal input thereto via the second signal input terminal based on the first output signal.

13 Claims, 12 Drawing Sheets

TIME-TO-DIGITAL CONVERTING CIRCUIT AND DIGITAL-TO-TIME CONVERTING CIRCUIT

CROSS-REFERENCE TO RELATED APPLICATION

This application is based upon and claims the benefit of priority from the prior Japanese Patent Application No. 2012-185439, filed on Aug. 24, 2012, the entire contents of which are incorporated herein by reference.

BACKGROUND

1. Field

Embodiments described herein relate generally to a time-to-digital converting circuit and a digital-to-time converting circuit.

2. Background Art

A conventional time-to-digital converting circuit converts time to a digital signal by sampling a signal delayed by an inverter or the like with a flip-flop.

DETAILED DESCRIPTION

A time-to-digital converting circuit according to an embodiment, that converts a time when a logic of a reference data signal changes in a reference period into a digital value, includes a first signal input terminal to which a reference data signal is input. The time-to-digital converting circuit a second signal input terminal to which a reference clock signal is input at a first point in time in the reference period. The time-to-digital converting circuit a first signal output terminal from which a first digital value, which is the most significant bit, is output. The time-to-digital converting circuit a second signal output terminal from which a second digital value, which is of a lower order than the first digital value, is output. The time-to-digital converting circuit a first flip-flop having a data terminal to which a signal based on the reference data signal input to the first signal input terminal is input, a clock terminal to which the reference clock signal input to the second signal input terminal is input, and an output terminal that is connected to the first signal output terminal and from which a first output signal is output. The time-to-digital converting circuit a first delay controlling circuit that outputs a first data signal obtained by controlling a delay time of the reference data signal input thereto via the first signal input terminal based on the first output signal and a first clock signal obtained by controlling a delay time of the reference clock signal input thereto via the second signal input terminal based on the first output signal. The time-to-digital converting circuit a second flip-flop having a data terminal to which a signal based on the first data signal is input, a clock terminal to which the first clock signal is input, and an output terminal that is connected to the second signal output terminal and from which a second output signal is output.

In the following, embodiments will be described with reference to the drawings.

First Embodiment

Figure 1:
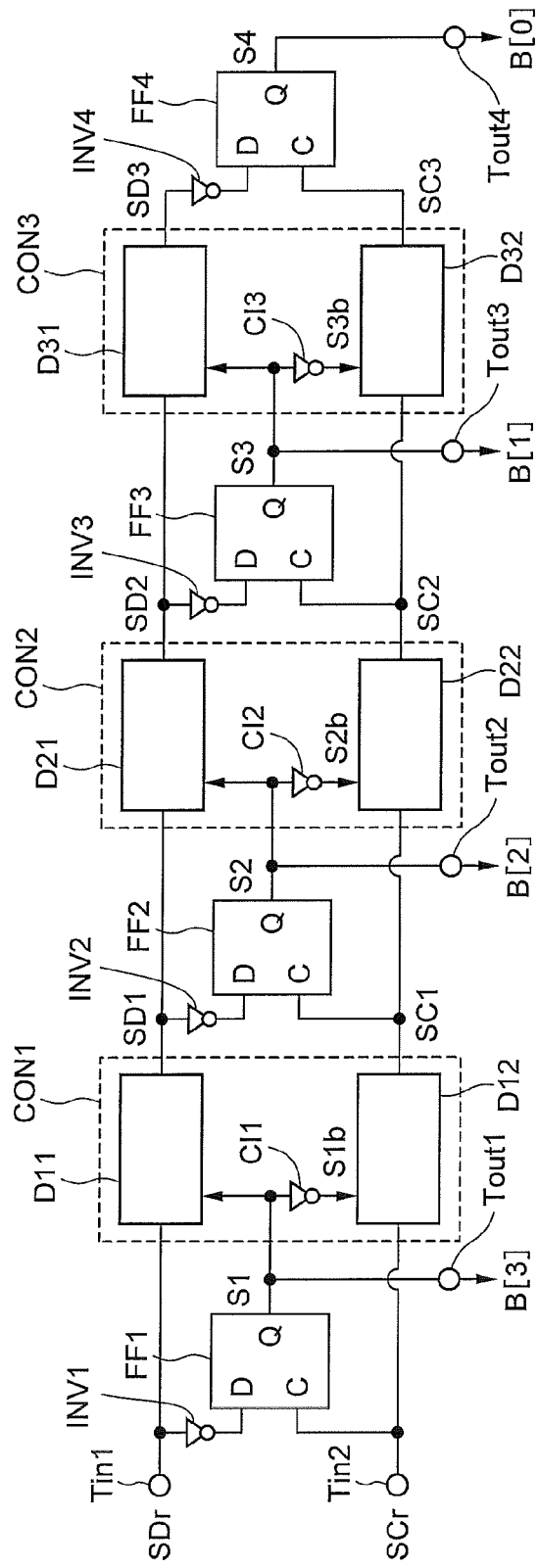
FIG. 1 is a diagram showing an example of a configuration of a time-to-digital converting circuit 100 according to a first embodiment.

FIG. 1 is a diagram showing an example of a configuration of a time-to-digital converting circuit 100 according to a first embodiment.

As shown in FIG. 1, the time-to-digital converting circuit 100 includes a first signal input terminal "Tin1", a second signal input terminal "Tin2", a first signal output terminal "Tout1", a second signal output terminal "Tout2", a third signal output terminal "Tout3", a fourth signal output terminal "Tout4", a first flip-flop "FF1", a second flip-flop "FF2", a third flip-flop "FF3", a fourth flip-flop "FF4", a first input inverter "INV1", a second input inverter "INV2", a third input inverter "INV3", a fourth input inverter "INV4", a first delay controlling circuit "CON1", a second delay controlling circuit "CON2", and a third delay controlling circuit "CON3".

The time-to-digital converting circuit 100 is configured to convert a time when the logic of a reference data signal "SDr" changes during a reference period "T" into a digital value.

The first signal input terminal "Tin1" is configured to receive the reference data signal "SDr".

The second signal input terminal "Tin2" is configured to receive a reference clock signal "SCr" at a first point in time in the reference period "T".

The first signal output terminal "Tout1" is configured to output a first digital value "B[3]" (a first output signal "S1"), which is the most significant bit.

The second signal output terminal "Tout2" is configured to output a second digital value "B[2]" (a second output signal "S2"), which is of a lower order than the first digital value.

The third signal output terminal "Tout3" is configured to output a third digital value "B[1]" (a third output signal "S3"), which is of a lower order than the second digital value.

The fourth signal output terminal "Tout4" is configured to output a fourth digital value "B[0]" (a fourth output signal "S4"), which is of a lower order than the third digital value.

The first input inverter "INV1" is connected to the first signal input terminal "Tin1" at an input thereof and to a data terminal "D" of the first flip-flop "FF1" at an output thereof.

The second input inverter "INV2" is connected to an output of a first delay switching circuit "D11" at an input thereof and to a data terminal "D" of the second flip-flop "FF2" at an output thereof.

The third input inverter "INV3" is connected to an output of a first delay switching circuit "D21" at an input thereof and to a data terminal "D" of the third flip-flop "FF3" at an output thereof.

The fourth input inverter "INV4" is connected to an output of a first delay switching circuit "D31" at an input thereof and to a data terminal "D" of the fourth flip-flop "FF4" at an output thereof.

The first flip-flop "FF1" has the data terminal "D" to which a signal based on the reference data signal "SDr" input to the first signal input terminal "Tin1" (a signal output from the first input inverter "INV1") is input, a clock terminal "C" to which the reference clock signal "SCr" input to the second signal input terminal "Tin2" is input, and an output terminal "Q" that is connected to the first signal output terminal "Tout1" and from which the first output signal "S1" is output.

The first delay controlling circuit "CON1" is configured to output a first data signal "SD1" obtained by controlling the delay time of the reference data signal "SDr" input thereto via the first signal input terminal "Tin1" based on the first output signal "S1". The first delay controlling circuit "CON1" is further configured to output a first clock signal "SC1" obtained by controlling the delay time of the reference clock signal "SCr" input thereto via the second signal input terminal "Tin2" based on the first output signal "S1".

For example, if the logic of the reference data signal "SDr" changes before the first point in time, the first delay controlling circuit "CON1" is configured to perform such a control that the delay time of the reference clock signal "SCr" is shorter than the delay time of the reference data signal "SDr".

On the other hand, if the logic of the reference data signal "SDr" changes after the first point in time, the first delay controlling circuit "CON1" is configured to perform such a control that the delay time of the reference clock signal "SCr" is longer than the delay time of the reference data signal "SDr".

The second flip-flop "FF2" has the data terminal "D" to which a signal based on the first data signal "SD1" (a signal output from the second input inverter "INV2") is input, a clock terminal "C" to which the first clock signal "SC1" is input, and an output terminal "Q" that is connected to the second signal output terminal "Tout2" and from which the second output signal "S2" is output.

The second delay controlling circuit "CON2" is configured to receive the first data signal "SD1" and the first clock signal "SC1". The second delay controlling circuit "CON2" is configured to output a second data signal "SD2" obtained by controlling the delay time of the first data signal "SD1" based on the second output signal "S2". The second delay controlling circuit "CON2" is further configured to output a second clock signal "SC2" obtained by controlling the delay time of the first clock signal "SC1" based on the second output signal "S2".

For example, if the logic of the first data signal "SD1" changes before a second point in time, the second delay controlling circuit "CON2" is configured to perform such a control that the delay time of the first clock signal "SC1" is shorter than the delay time of the first data signal "SD1".

On the other hand, if the logic of the first data signal "SD1" changes after the second point in time, the second delay controlling circuit "CON2" is configured to perform such a control that the delay time of the first clock signal "SC1" is longer than the delay time of the first data signal "SD1".

The third flip-flop "FF3" has the data terminal "D" to which the second data signal "SD2" is input, a clock terminal "C" to which the second clock signal "SC2" is input, and an output terminal "Q" that is connected to the third signal output terminal "Tout3" and from which the third output signal "S3" is output.

The third delay controlling circuit "CON3" is configured to receive the second data signal "SD2" and the second clock signal "SC2". The third delay controlling circuit "CON3" is configured to output a third data signal "SD3" obtained by controlling the delay time of the second data signal "SD2" based on the third output signal "S3". The third delay controlling circuit "CON3" is further configured to output a third clock signal "SC3" obtained by controlling the delay time of the second clock signal "SC2" based on the third output signal "S3".

For example, if the logic of the second data signal "SD2" changes before a third point in time, the third delay controlling circuit "CON3" is configured to perform such a control that the delay time of the second clock signal "SC2" is shorter than the delay time of the second data signal "SD2".

On the other hand, if the logic of the second data signal "SD2" changes after the third point in time, the third delay controlling circuit "CON3" is configured to perform such a control that the delay time of the second clock signal "SC2" is longer than the delay time of the second data signal "SD2".

The fourth flip-flop "FF4" has the data terminal "D" to which the third data signal "SD3" is input, a clock terminal "C" to which the third clock signal "SC3" is input, and an output terminal "Q" that is connected to the fourth signal output terminal "Tout4" and from which the fourth output signal "S4" is output.

As shown in FIG. 1, the first delay controlling circuit "CON1" has the first delay switching circuit "D11", a second delay switching circuit "D12", and a controlling inverter "CI1", for example.

The controlling inverter "CI1" is connected to the output terminal "Q" of the first flip-flop "FF1" at an input thereof and is configured to output a signal "S1b" obtained by inverting the first output signal "S1".

The first delay switching circuit "D11" is configured to output the first data signal "SD1" obtained by controlling the delay time of the reference data signal "SDr" input thereto via the first signal input terminal "Tin1" based on the first output signal "S1".

The second delay switching circuit "D12" is configured to output the first clock signal "SC1" obtained by controlling the delay time of the reference clock signal "SCr" input thereto via the second signal input terminal "Tin2" based on the first output signal "S1" (the signal "S1b").

Figure 2:
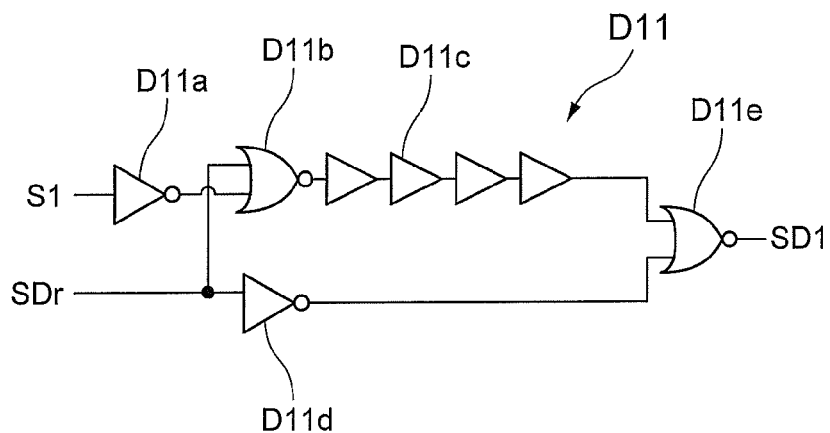
FIG. 2 is a circuit diagram showing an example of a circuit configuration of the first delay switching circuit "D11" shown in FIG. 1.

FIG. 2 is a circuit diagram showing an example of a circuit configuration of the first delay switching circuit "D11" shown in FIG. 1.

As shown in FIG. 2, the first delay switching circuit "D11" has a first inverter "D11a", a first NOR circuit "D11b", a first delay circuit "D11c", a second inverter "D11d", and a second NOR circuit "D11e".

The first inverter "D11a" is connected to the output terminal "Q" of the first flip-flop "FF1" at an input thereof.

The first NOR circuit "D11b" is connected to the first signal input terminal "Tin1" and an output of the first inverter "D11a" at inputs thereof.

The first delay circuit "D11c" is connected to an output of the first NOR circuit "D11b" at an input thereof and is configured to delay the signal input from the first NOR circuit "D11b" by a first delay time and output the delayed signal.

The second inverter "D11d" is connected to the first signal input terminal "Tin1" at an input thereof.

The second NOR circuit "D11e" is connected to an output of the first delay circuit "D11c" and an output of the second inverter "D11d" at inputs thereof and is configured to output the first data signal "SD1" at an output thereof.

Figure 3:
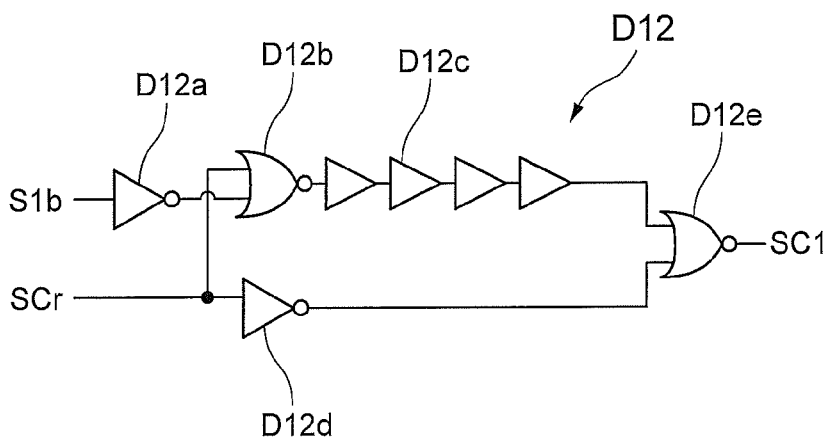
FIG. 3 is a circuit diagram showing an example of a circuit configuration of the second delay switching circuit "D12" shown in FIG. 1.

FIG. 3 is a circuit diagram showing an example of a circuit configuration of the second delay switching circuit "D12" shown in FIG. 1.

As shown in FIG. 3, the second delay switching circuit "D12" has a third inverter "D12a", a third NOR circuit "D12b", a second delay circuit "D12c", a fourth inverter "D12d", and a fourth NOR circuit "D12e".

The third inverter "D12a" is connected to an output of the controlling inverter "CI1" at an input thereof.

The third NOR circuit "D12b" is connected to the second signal input terminal "Tin2" and an output of the third inverter "D12a" at inputs thereof.

The second delay circuit "D12c" is connected to an output of the third NOR circuit "D12b" at an input thereof and is configured to delay the signal input from the second NOR circuit "D12b" by the first delay time and output the delayed signal. In the example shown in FIG. 1, the delay time of the second delay circuit "D12c" is equal to the delay time of the first delay circuit "D11c".

The fourth inverter "D12d" is connected to the second signal input terminal "Tin2" at an input thereof.

The fourth NOR circuit "D12e" is connected to an output of the second delay circuit "D12c" and an output of the fourth inverter "D12d" at inputs thereof and is configured to output the first clock signal "SC1" at an output thereof.

As shown in FIG. 1, the second delay controlling circuit "CON2" has the first delay switching circuit "D21", a second delay switching circuit "D22", and a controlling inverter "CI2", for example.

The controlling inverter "CI2" is connected to the output terminal "Q" of the second flip-flop "FF2" at an input thereof and is configured to output a signal "S2b" obtained by inverting the second output signal "S2".

The first delay switching circuit "D21" is configured to output the second data signal "SD2" obtained by controlling the delay time of the first data signal "SD1" input from the first delay switching circuit "D11" based on the second output signal "S2".

The second delay switching circuit "D22" is configured to output the second clock signal "SC2" obtained by controlling the delay time of the first clock signal "SC1" input from the second delay switching circuit "D12" based on the second output signal "S2" (the signal "S2b").

Figure 4:
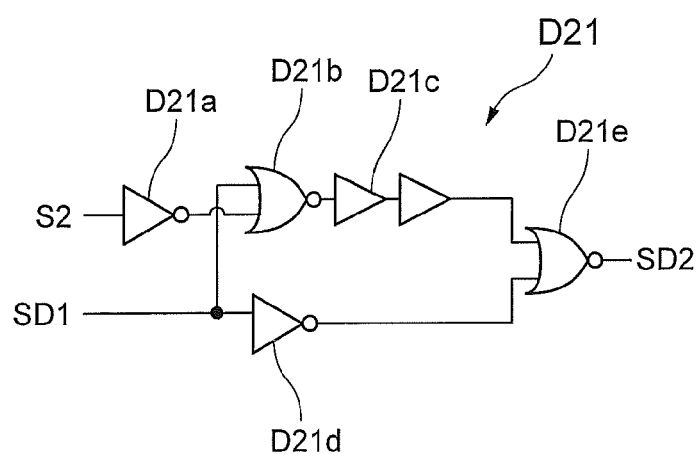
FIG. 4 is a circuit diagram showing an example of a circuit configuration of the first delay switching circuit "D21" shown in FIG. 1.

FIG. 4 is a circuit diagram showing an example of a circuit configuration of the first delay switching circuit "D21" shown in FIG. 1.

As shown in FIG. 4, the first delay switching circuit "D21" has a first inverter "D21a", a first NOR circuit "D21b", a first delay circuit "D21c", a second inverter "D21d", and a second NOR circuit "D21e".

The first inverter "D21a" is connected to the output terminal "Q" of the second flip-flop "FF2" at an input thereof.

The first NOR circuit "D21b" is connected to the output of the first delay switching circuit "D11" and an output of the first inverter "D21a" at inputs thereof.

The first delay circuit "D21c" is connected to an output of the first NOR circuit "D21b" at an input thereof and is configured to delay the signal input from the first NOR circuit "D21b" by a second delay time and output the delayed signal.

The second inverter "D21d" is connected to the output of the first delay switching circuit "D11" at an input thereof.

The second NOR circuit "D21e" is connected to an output of the first delay circuit "D21c" and an output of the second inverter "D21d" at inputs thereof and is configured to output the second data signal "SD2" at an output thereof.

Figure 5:
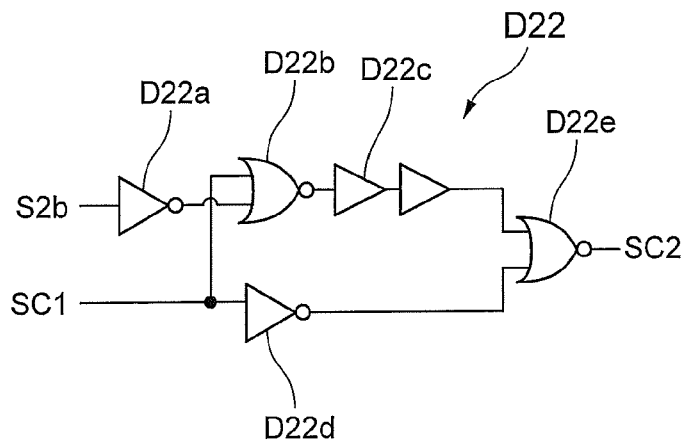
FIG. 5 is a circuit diagram showing an example of a circuit configuration of the second delay switching circuit "D22" shown in FIG. 1.

FIG. 5 is a circuit diagram showing an example of a circuit configuration of the second delay switching circuit "D22" shown in FIG. 1.

As shown in FIG. 5, the second delay switching circuit "D22" has a third inverter "D22a", a third NOR circuit "D22b", a second delay circuit "D22c", a fourth inverter "D22d", and a fourth NOR circuit "D22e".

The third inverter "D22a" is connected to an output of the controlling inverter "CI2" at an input thereof.

The third NOR circuit "D22b" is connected to an output of the second delay switching circuit "D12" and an output of the third inverter "D22c" at inputs thereof.

The second delay circuit "D22c" is connected to an output of the third NOR circuit "D22b" at an input thereof and is configured to delay the signal input from the third NOR circuit "D22b" by the second delay time and output the delayed signal. In the example shown in FIG. 1, the delay time of the second delay circuit "D22c" is equal to the delay time of the first delay circuit "D21c".

The fourth inverter "D22d" is connected to the output of the second delay switching circuit "D12" at an input thereof.

The fourth NOR circuit "D22e" is connected to an output of the second delay circuit "D22c" and an output of the fourth inverter "D22d" at inputs thereof and is configured to output the second clock signal "SC2" at an output thereof.

As shown in FIG. 1, the third delay controlling circuit "CON3" has the first delay switching circuit "D31", a second delay switching circuit "D32", and a controlling inverter "CI3", for example.

The controlling inverter "CI3" is connected to the output terminal "Q" of the third flip-flop "FF3" at an input thereof and is configured to output a signal "S3b" obtained by inverting the third output signal "S3".

The first delay switching circuit "D31" is configured to output the third data signal "SD3" obtained by controlling the delay time of the second data signal "SD2" input from the first delay switching circuit "D21" based on the third output signal "S3".

The second delay switching circuit "D32" is configured to output the third clock signal "SC3" obtained by controlling the delay time of the second clock signal "SC2" input from the second delay switching circuit "D22" based on the third output signal "S3" (the signal "S3b").

Figure 6:
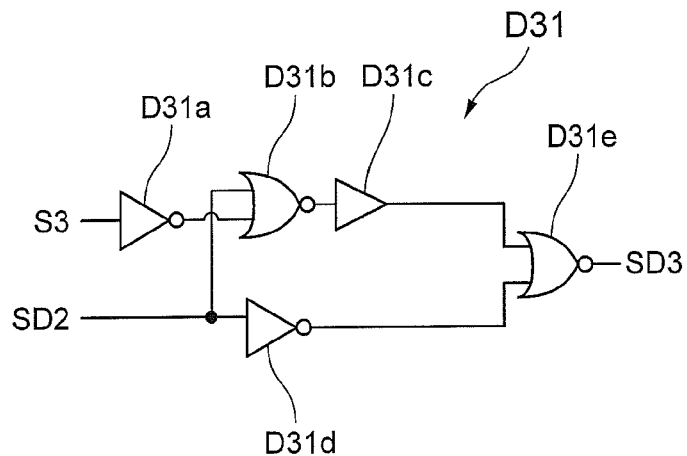
FIG. 6 is a circuit diagram showing an example of a circuit configuration of the first delay switching circuit "D31" shown in FIG. 1.

FIG. 6 is a circuit diagram showing an example of a circuit configuration of the first delay switching circuit "D31" shown in FIG. 1.

As shown in FIG. 6, the first delay switching circuit "D31" has a first inverter "D31a", a first NOR circuit "D31b", a first delay circuit "D31c", a second inverter "D31d", and a second NOR circuit "D31e".

The first inverter "D31a" is connected to the output terminal "Q" of the third flip-flop "FF3" at an input thereof.

The first NOR circuit "D31b" is connected to the output of the first delay switching circuit "D21" and an output of the first inverter "D31a" at inputs thereof.

The first delay circuit "D31c" is connected to an output of the first NOR circuit "D31b" at an input thereof and is configured to delay the signal input from the first NOR circuit "D31b" by a third delay time and output the delayed signal.

The second inverter "D31d" is connected to the output of the first delay switching circuit "D21" at an input thereof.

The second NOR circuit "D31e" is connected to an output of the first delay circuit "D31c" and an output of the second inverter "D31d" at inputs thereof and is configured to output the third data signal "SD3" at an output thereof.

Figure 7:
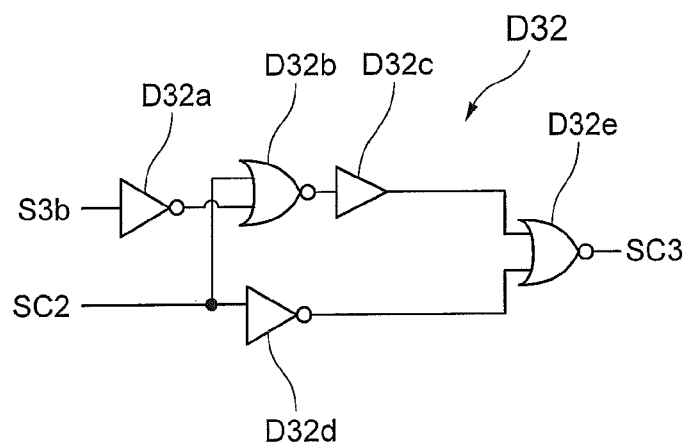
FIG. 7 is a circuit diagram showing an example of a circuit configuration of the second delay switching circuit "D32" shown in FIG. 1.

FIG. 7 is a circuit diagram showing an example of a circuit configuration of the second delay switching circuit "D32" shown in FIG. 1.

As shown in FIG. 7, the second delay switching circuit "D32" has a third inverter "D32a", a third NOR circuit "D32b", a second delay circuit "D32c", a fourth inverter "D32d", and a fourth NOR circuit "D32e".

The third inverter "D32a" is connected to an output of the controlling inverter "CI3" at an input thereof.

The third NOR circuit "D32b" is connected to an output of the second delay switching circuit "D22" and an output of the third inverter "D32a" at inputs thereof.

The second delay circuit "D32c" is connected to an output of the third NOR circuit "D32b" at an input thereof and is configured to delay the signal input from the third NOR circuit "D32b" by the third delay time and output the delayed signal. In the example shown in FIG. 1, the delay time of the second delay circuit "D32c" is equal to the delay time of the first delay circuit "D31c".

The fourth inverter "D32d" is connected to the output of the second delay switching circuit "D22" at an input thereof.

The fourth NOR circuit "D32e" is connected to an output of the second delay circuit "D32c" and an output of the fourth inverter "D32d" at inputs thereof and is configured to output the third clock signal "SC3" at an output thereof.

As shown in FIGS. 2 to 7 described above, the first delay switching circuits "D11" to "D31" and the second delay switching circuits "D12" to "D32" have the same circuit configurations except for the configuration of the delay circuit (the delay time). In this example, the second delay time is set at a half of the first delay time, and the third delay time is set at a quarter of the first delay time. Such setting of the delay time can be achieved by connecting unit delay circuits having a certain delay time (each of which is denoted by a reference symbol in the drawings) in cascade according to the desired delay time ratio as shown in FIGS. 2 to 7. Specifically, FIGS. 2 and 3 show a cascade connection of four unit delay circuits, FIGS. 4 and 5 show a cascade connection of two unit delay circuits, and FIGS. 6 and 7 show a single unit delay circuit.

Figure 8:
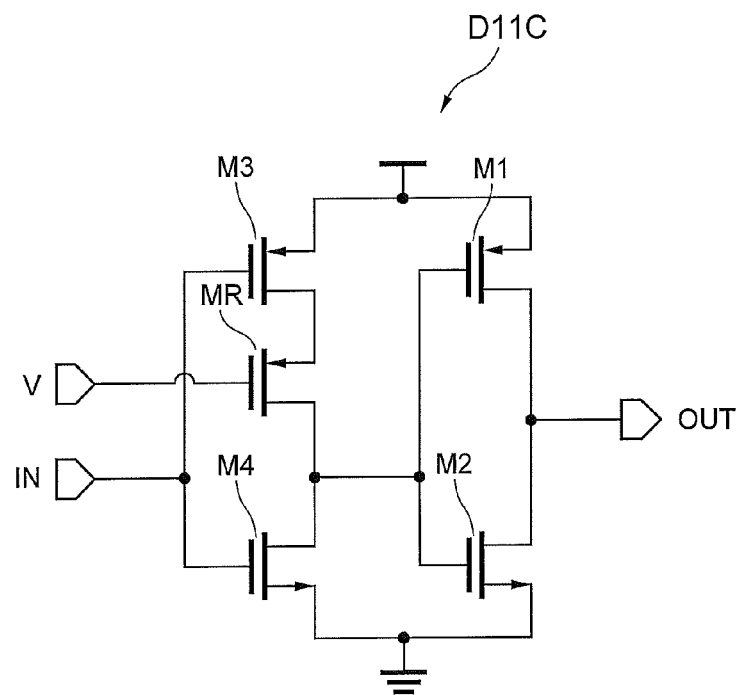
FIG. 8 is a circuit diagram showing another example of the circuit configuration of the first delay circuit "D11c" shown in FIG. 2.

FIG. 8 is a circuit diagram showing another example of the circuit configuration of the first delay circuit "D11c" shown in FIG. 2.

As shown in FIG. 8, the first delay circuit "D11c" has a first pMOS transistor "M1", a first nMOS transistor "M2", a second pMOS transistor "M3", a second nMOS transistor "M4", and a variable resistor "MR".

The first pMOS transistor "M1" is connected to a power supply at the source thereof and to an output "OUT" of the first delay circuit "D11c" at the drain thereof.

The first nMOS transistor "M2" is connected to the output of the first delay circuit "D11c" at the drain thereof, to the ground at the source thereof and to the gate of the first pMOS transistor "M1" at the gate thereof.

The second pMOS transistor "M3" is connected between the power supply and the gate of the first pMOS transistor "M1" and is connected to an input "IN" of the first delay circuit "D11c" at the gate thereof.

The second nMOS transistor "M4" is connected between the gate of the first pMOS transistor "M1" and the ground and is connected to the input "IN" of the first delay circuit "D11c" at the gate thereof.

The variable resistor "MR" is connected in series with the second pMOS transistor "M3" and the second nMOS transistor "M4" between the power supply and the ground. In the example shown in FIG. 8, in particular, the variable resistor "MR" is connected between the drain of the second pMOS transistor and the gate of the first pMOS transistor "M1".

The variable resistor "MR" is a MOS transistor (a pMOS transistor in FIG. 8) to the gate of which a controlling voltage "V" is applied. The resistance of the variable resistor "MR" is changed by changing the controlling voltage "V".

Thus, the first delay circuit "D11c" controls the delay time by taking advantage of the fact that the on-resistance varies depending on the gate voltage (the controlling voltage "V") of the pMOS transistor "MR" between the drain of the pMOS transistor "M3" of the inverter circuit and the output.

Thus, the first delay circuit "D11c" can set a wide range of delay time while requiring a small footprint.

Although the variable resistor "MR" is inserted between the drain of the pMOS transistor "M3" and the output in the example shown in FIG. 8, the variable resistor "MR" may be inserted between the power supply and the source of the pMOS transistor "M3". Furthermore, although the variable resistor "MR" is inserted on the side of the pMOS transistor to adjust the rise time of the output, the variable resistor "MR" may be inserted on the side of the nMOS transistor to adjust the fall time. Both the rise time and the fall time can also be adjusted.

Although the on-resistance of the MOS transistor is changed by changing the controlling voltage in the example shown in FIG. 8, the threshold voltage may be controlled instead of the gate voltage. The threshold voltage can be changed by changing the back gate voltage of the MOS transistor. In this case, the controlling voltage "V" corresponds to the back gate voltage. Alternatively, a device whose threshold voltage can be adjusted after manufacture, such as a SONOS device, may be used.

Figure 9:
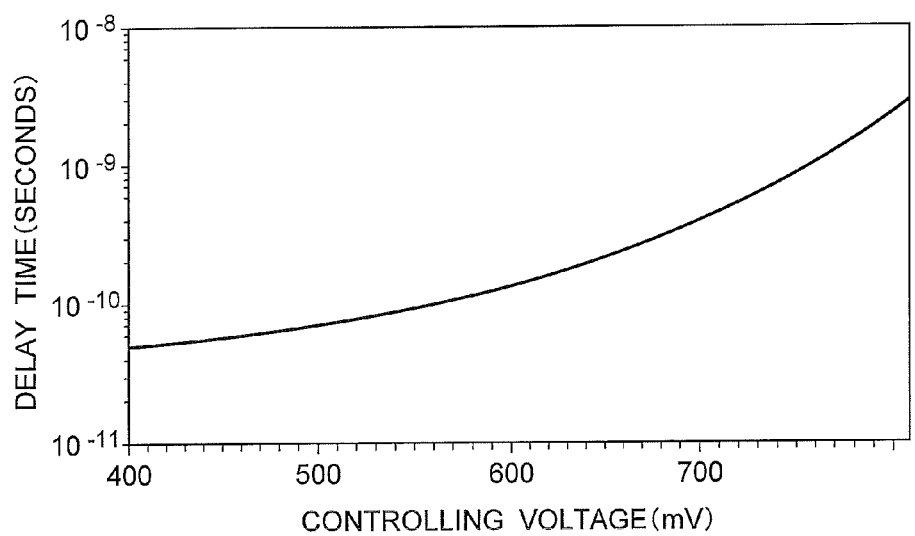
FIG. 9 is a graph showing an example of delay characteristics of the first delay circuit "D11c" shown in FIG. 8.

FIG. 9 is a graph showing an example of delay characteristics of the first delay circuit "D11c" shown in FIG. 8.

As shown in FIG. 9, the first delay circuit "D11c" can set the delay time at a desired value by changing the controlling voltage "V".

Figure 10:
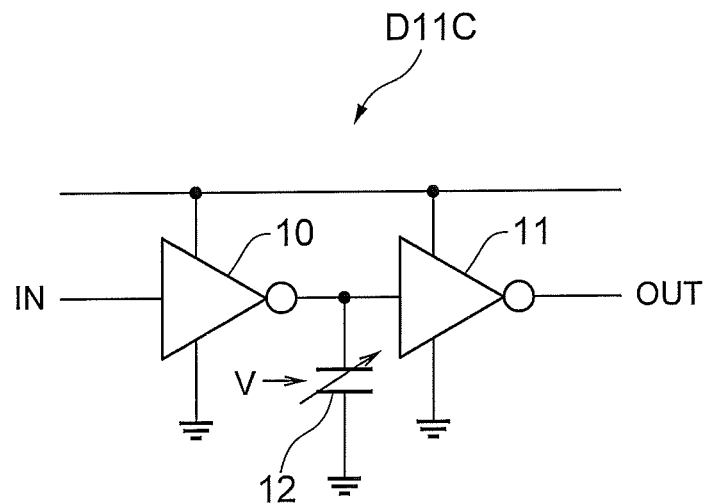
FIG. 10 is a circuit diagram showing another example of the circuit configuration of the first delay circuit "D11c" shown in FIG. 2.

FIG. 10 is a circuit diagram showing another example of the circuit configuration of the first delay circuit "D11c" shown in FIG. 2.

As shown in FIG. 10, the first delay circuit "D11c" has a first delay inverter 10, a second delay inverter 11, and a variable capacitor 12.

The first delay inverter 10 is input to the input "IN" of the first delay circuit "D11c" at an input thereof.

The second delay inverter 11 is connected to an output of the first delay inverter 10 at an input thereof and to the output "OUT" of the first delay circuit "D11c" at an output thereof.

The variable capacitor 12 is connected between the output of the first delay inverter 10 and the ground and is configured to change the capacitance depending on the controlling voltage "V".

The first delay circuit "D11c" configured in this way can set the delay time at a desired value by changing the controlling voltage "V" to change the capacitance of the variable capacitor 12.

Figure 11:
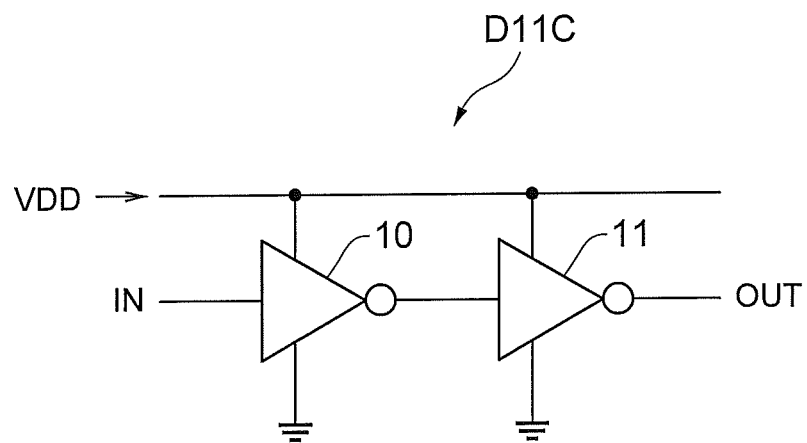
FIG. 11 is a circuit diagram showing another example of the circuit configuration of the first delay circuit "D11c" shown in FIG. 2.

FIG. 11 is a circuit diagram showing another example of the circuit configuration of the first delay circuit "D11c" shown in FIG. 2.

As shown in FIG. 11, the first delay circuit "D11c" has the first delay inverter 10 and the second delay inverter 11.

The first delay inverter 10 is input to the input "IN" of the first delay circuit "D11c" at the input thereof.

The second delay inverter 11 is connected to the output of the first delay inverter 10 at the input thereof and to the output "OUT" of the first delay circuit "D11c" at the output thereof.

A power supply voltage "VDD" supplied to the first and second delay inverters 10 and 11 is controlled.

The first delay circuit "D11c" configured in this way can set the delay time at a desired value by changing the power supply voltage "VDD".

Although FIGS. 8, 10 and 11 show examples of the circuit configuration of the first delay circuit "D11c", the other first and second delay circuits shown in FIGS. 3 to 7 can also have these circuit configurations.

Figure 12:
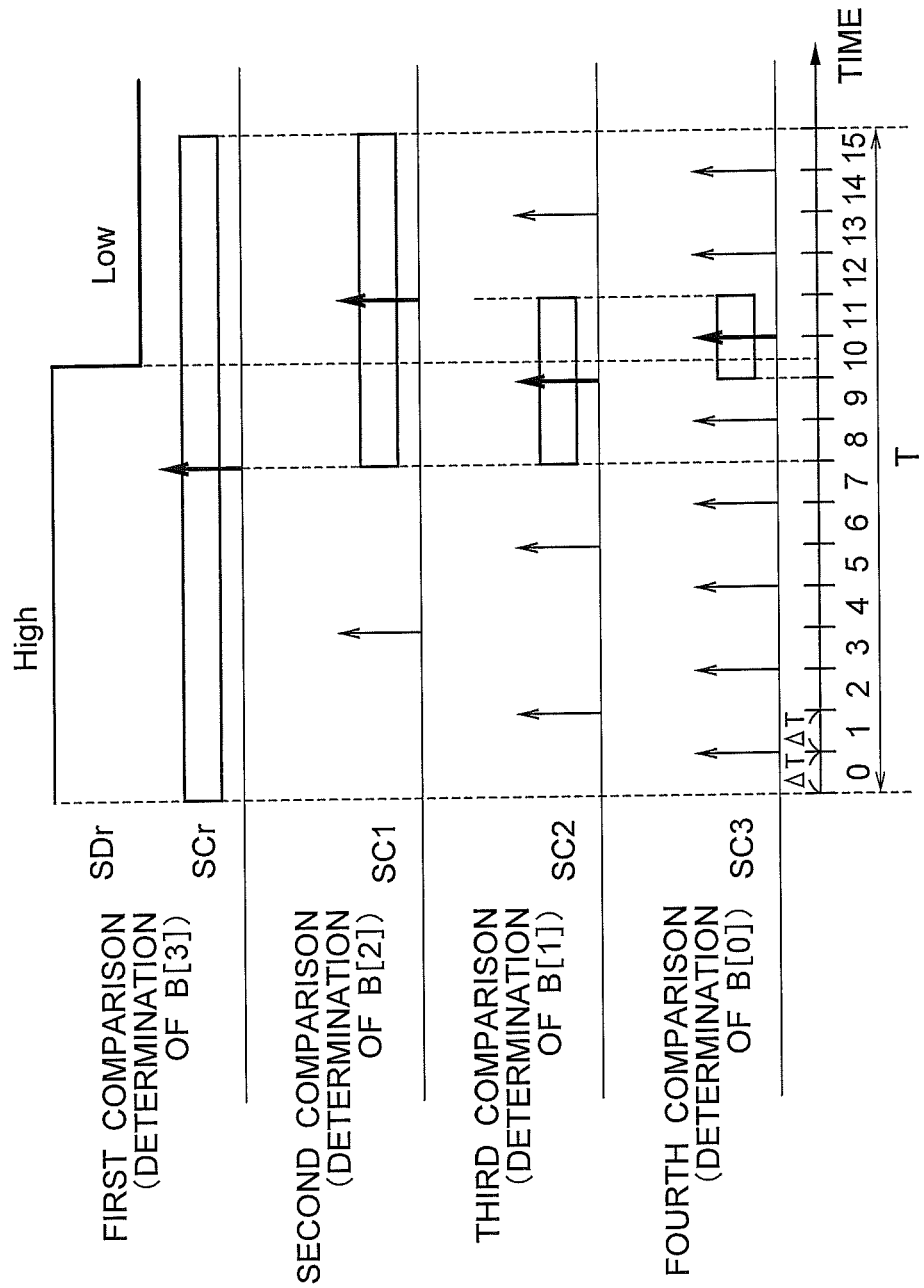
FIG. 12 is a diagram showing an example of timings of signals in the time-to-digital converting circuit 100 shown in FIG. 1.

Next, an operation of the time-to-digital converting circuit 100 having the configuration described above will be described. FIG. 12 is a diagram showing an example of timings of signals in the time-to-digital converting circuit 100 shown in FIG. 1.

In the example shown in FIG. 12, the reference data signal "SDr" transitions from the "High" level to the "Low" level at a time of $10\Delta T$. Thus, measurement of this transition will be discussed in the following. Note that the first delay time, which is the difference between the delay time of the reference data signal "SDr" and the delay time of the reference clock signal "SCr", is set at a quarter of the reference period "T". And the second delay time, which is the difference between the delay time of the first data signal "SD1" and the delay time of the first clock signal "SC1", is set at one eighth of the reference period "T". And the third delay time, which is the difference between the delay time of the second data signal "SD2" and the delay time of the second clock signal "SC2", is set at one sixteenth of the reference period "T".

Therefore, for example, the first delay time of the first delay controlling circuit "CON1", which is the difference between the delay time of the reference data signal "SDr" and the delay time of the clock signal, is twice as long as the second delay time of the second delay controlling circuit "CON2", which is the difference between the delay time of the first data signal "SD1" and the delay time of the first clock signal "SC1".

In the example shown in FIG. 12, transitions of the first to third data signals "SD1" to "SD3" occur concurrently with a transition of the reference data signal "SDr".

As shown in FIG. 12, for the first comparison, the time of the reference clock signal "SCr" is set at the center of the measurement range (the reference period "T" composed of sub-periods 0 to 15). Provided that the length of each sub-period 0 to 15 is $\Delta T$, in the case of a 4-bit signal, the time of the reference clock signal "SCr" lags behind the time 0 by $2^{(4-1)} \times \Delta T = 8\Delta T$.

At the time of the reference clock signal "SCr", the reference data signal "SDr" is at the "High" level, so that the output (the first digital value "B[3]") of the first DFF (the first flip-flop "FF1") is "High".

This result shows that falling of the reference data signal "SDr" occurs in any of the sub-periods 8 to 15. Thus, for the second comparison, the time of the first clock signal "SC1" is set at a time that lags behind the time 0 by $12\Delta T$, which is at the center of the sub-periods 8 to 15.

At the time of the first clock signal "SC1", the reference data signal "SDr" (the first data signal "SD1") is at the "Low" level, so that the output (the second digital value "B[2]") of the second DFF (the second flip-flop "FF2") is "Low".

This result shows that falling of the reference data signal "SDr" occurs in any of the sub-periods 8 to 11.

Thus, for the third comparison, the time of the second clock signal "SC2" is set at a time that lags behind the time 0 by $10\Delta T$, which is at the center of the sub-periods 8 to 11.

At the time of the second clock signal "SC2", the reference data signal "SDr" (the second data signal "SD2") is at the "High" level, so that the output (the third digital value "B[1]") of the third DFF (the third flip-flop "FF3") is "High".

This result shows that falling of the reference data signal "SDr" occurs in any of the sub-periods 10 and 11.

Thus, for the fourth comparison, the time of the third clock signal "SC3" is set at a time that lags behind the time 0 by $11\Delta T$, which is at the center of the sub-periods 10 and 11.

At the time of the third clock signal "SC3", the reference data signal "SDr" (the third data signal "SD3") is at the "Low" level, so that the output (the fourth digital value "B[0]") of the fourth DFF (the fourth flip-flop "FF4") is "Low". Therefore, the output "B[3]" is determined as 1010=10.

In this way, a 4-bit result can be obtained by four comparisons by adjusting the times of the first to third clock signals "SC1" to "SC3" based on their respective higher order bits.

This process is similar to a successive approximation type analog-to-digital conversion (ADC) process, which is a kind of ADC process.

In the example shown in FIG. 12, the time of the clock signal is shifted leftward when the result for the higher order bit is "0". However, this corresponds to advancing the timing, that is, going backwards in time and therefore is impossible.

A process equivalent to the process described above can be achieved by delaying the data signal instead of advancing the time of the clock signal.

Figure 13:
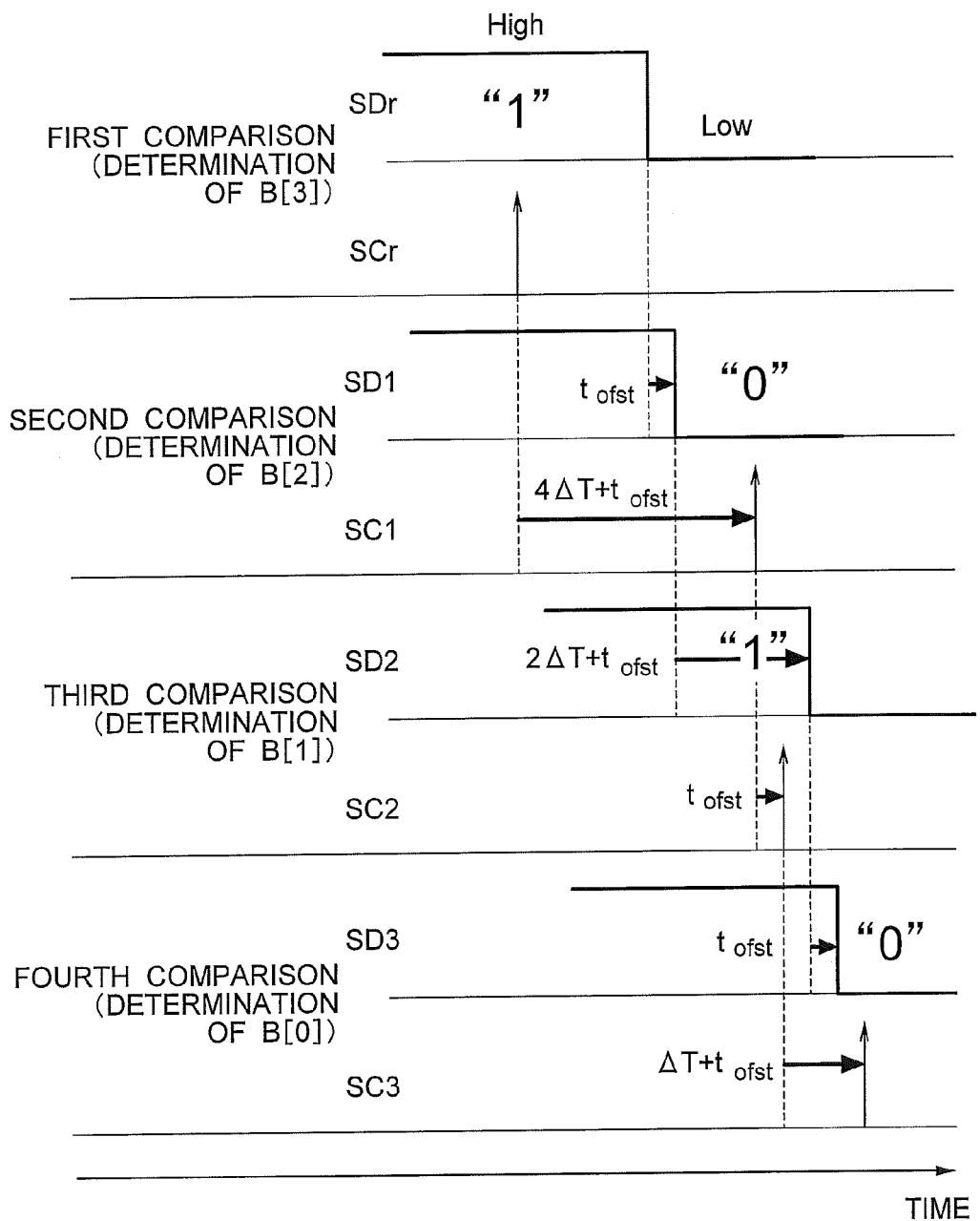
FIG. 13 is a diagram showing another example of timings of signals in the time-to-digital converting circuit 100 shown in FIG. 1.

FIG. 13 is a diagram showing another example of timings of signals in the time-to-digital converting circuit 100 shown in FIG. 1. FIG. 13 shows a case where a delay time $t_{ofst}$ is added both on the data line and the clock line. In the example shown in FIG. 13, the time of a transition of the reference data signal is the same as in the example shown in FIG. 12. FIG. 13 also shows relationships between the first to third data signals "SD1" to "SD3" and the first to third clock signals "SC1" to "SC3". Furthermore, in the example shown in FIG. 13, the difference in delay time between the first data signal "SD1" and the first clock signal "SC1" is the same as in the example shown in FIG. 12. The same holds true for the relationships between the second and third data signals "SD2" and "SD3" and the second and third clock signals "SC2" and "SC3".

As shown in FIG. 13, the clock signal is delayed when the higher order bit is "1", and the data signal is delayed when the higher order bit is "0", so that the clock signal and the data signal in each comparison are related in the same way as in the example shown in FIG. 12.

The delay times can be 4ΔT, 2ΔT and 1ΔT. However, in order to meet timing restrictions, an equal amount of delay time can also be added on each of the data line and the clock line.

Figure 14:
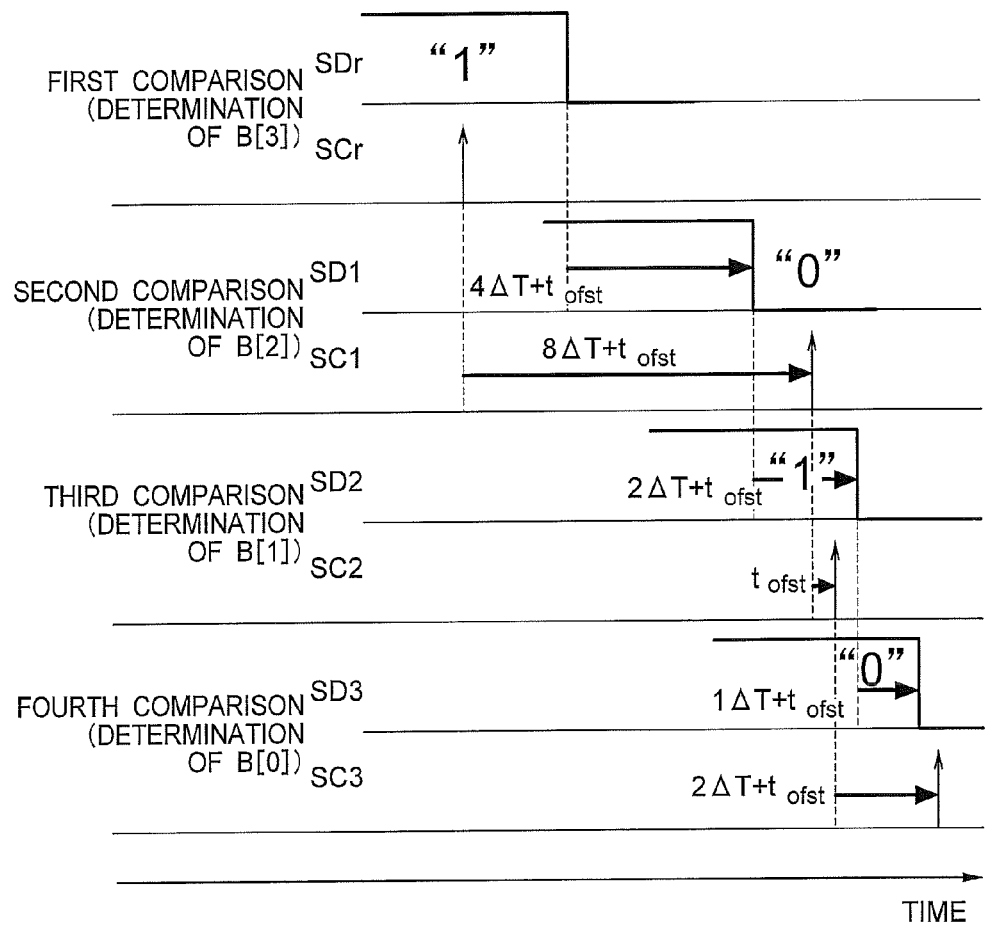
FIG. 14 is a diagram showing another example of timings of signals in the time-to-digital converting circuit 100 shown in FIG. 1.

FIG. 14 is a diagram showing another example of timings of signals in the time-to-digital converting circuit 100 shown in FIG. 1. FIG. 14 shows an example in which the delay time on the data line is fixed, and the delay amount on the clock line is variable.

As shown in FIG. 14, the delay time of the clock signal varies depending on whether the higher order bit is "1" or "0". In this way, the clock signal and the data signal in each comparison are related in the same way as in the example shown in FIG. 12.

Note that, in this case, conversion takes a longer time than in the examples shown in FIGS. 12 and 13.

Next, a method of controlling the delay time of each delay circuit will be described.

Figure 15:
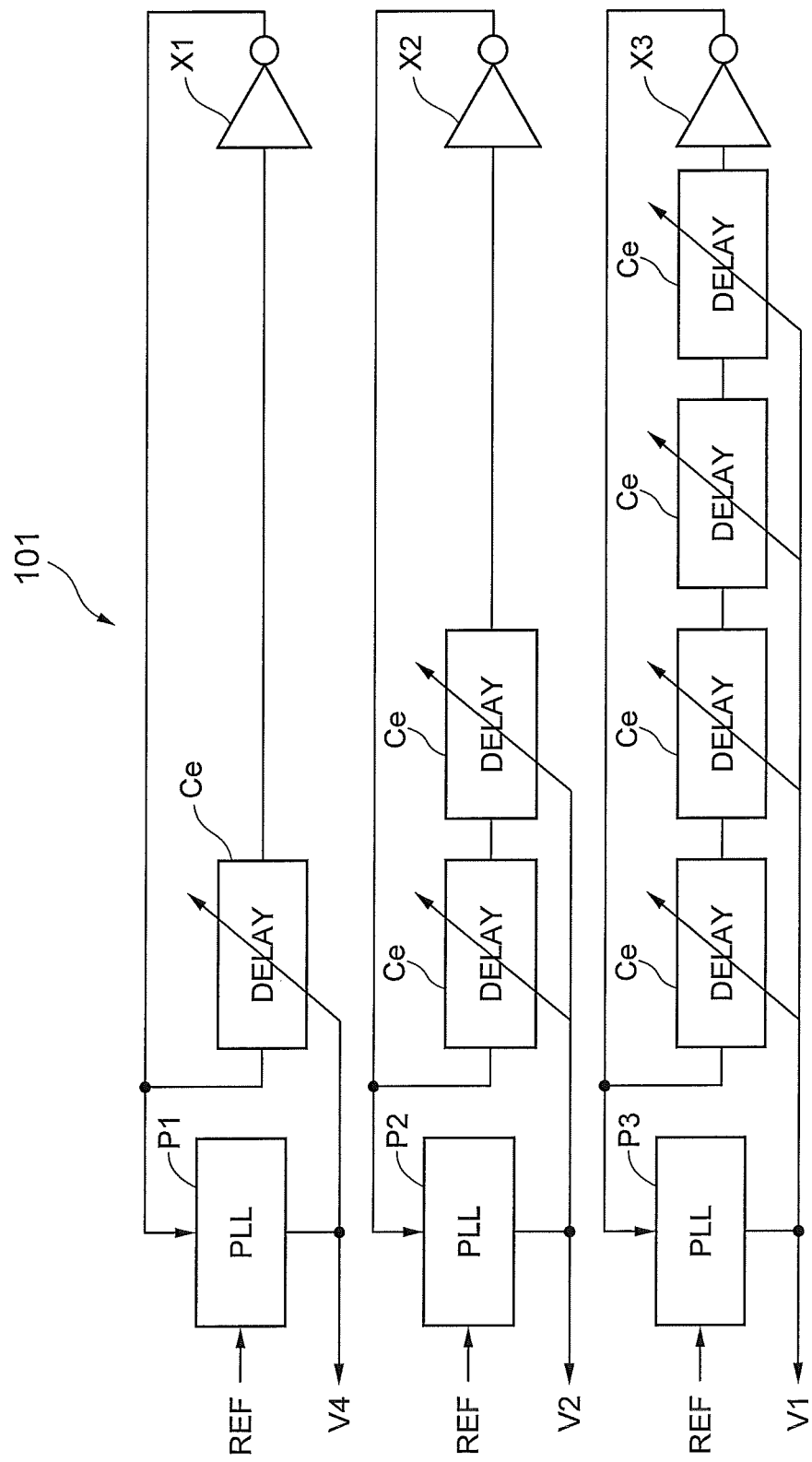
FIG. 15 is a block diagram showing an example of a configuration of a delay time controlling circuit 101.

FIG. 15 is a block diagram showing an example of a configuration of a delay time controlling circuit 101.

As shown in FIG. 15, the controlling circuit 101 has PLL circuits "P1", "P2" and "P3", a plurality of delay cells "Ce", and inverters "X1", "X2" and "X3".

One delay cell "Ce" and the inverter "X1" form a ring oscillator. The PLL circuit "P1" can determine a reference voltage "REF" so as to set the oscillation frequency at a desired value, thereby providing a controlling voltage "V4" that provides the third delay time.

Similarly, two delay cells "Ce" and the inverter "X2" form a ring oscillator. The PLL circuit "P2" can determine the reference voltage "REF" so as to set the oscillation frequency at a desired value, thereby providing a controlling voltage "V2" that provides the second delay time.

Similarly, four delay cells "Ce" and the inverter "X3" form a ring oscillator. The PLL circuit "P3" can determine the reference voltage "REF" so as to set the oscillation frequency at a desired value, thereby providing a controlling voltage "V1" that provides the first delay time.

The resulting controlling voltages "V1" to "V3" are used as the controlling voltage "V" or the power supply voltage "VDD" of the delay circuits shown in FIGS. 8, 10 and 11, for example.

In this way, a binary-weighted delay time can be provided with a small circuit footprint.

The time-to-digital converting circuit incorporating the delay cells configured in this way can have a low power consumption and a small circuit footprint. Both the circuit footprint and the power consumption depend linearly on the number of bits.

The scheme using the controlling circuit 101 has an additional advantage that the delay time is fixed regardless of PVT variations.

Figure 16:
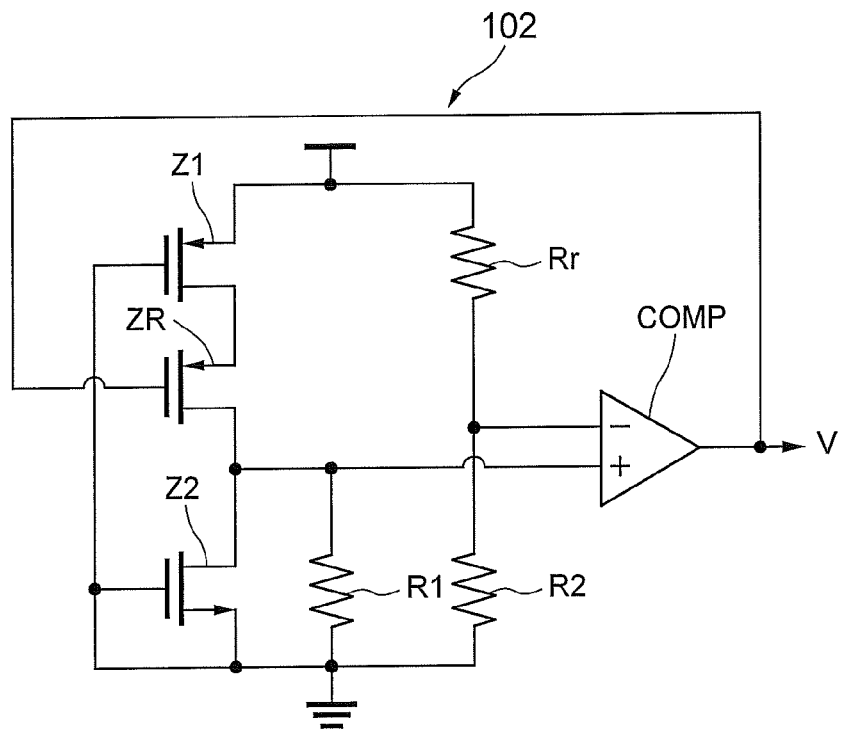
FIG. 16 is a block diagram showing an example of a configuration of a delay time controlling circuit 102.

In the example shown in FIG. 15 described above, the PLL circuit determines the controlling voltage. In the following, another method of determining the controlling voltage will be described. FIG. 16 is a block diagram showing an example of a configuration of a delay time controlling circuit 102.

As shown in FIG. 16, the controlling circuit 102 has a comparator "COMP", a reference resistor "Rr", a first resistor "R1", a second resistor "R2", a first pMOS transistor "Z1", a first nMOS transistor "Z2", and a variable resistor "ZR".

The reference resistor "Rr" is connected to the power supply at one end thereof and to an inverting input terminal of the comparator "COMP" at the other end thereof.

The first resistor "R1" is connected to a non-inverting input terminal of the comparator "COMP" at one end thereof and to the ground at the other end thereof.

The second resistor "R2" is connected to the inverting input terminal of the comparator "COMP" at one end thereof and to the ground at the other end thereof.

The first pMOS transistor "Z1" is connected between the power supply and the inverting input terminal of the comparator "COMP".

The second nMOS transistor "Z2" is connected between the power supply and the inverting input terminal of the comparator "COMP" and connected to the input "IN" of the first delay circuit "D11c" at the gate thereof.

The variable resistor "ZR" is connected in series with the first pMOS transistor "Z1" and the second nMOS transistor "Z2" between the power supply and the ground. The variable resistor "ZR" is an MOS transistor (a pMOS transistor in FIG. 16) connected to an output of the comparator "COMP" at the gate thereof. In the example shown in FIG. 16, in particular, the variable resistor "ZR" is connected between the drain of the first pMOS transistor "Z1" and the inverting input terminal of the comparator "COMP".

The comparator "COMP" is configured to output the controlling voltage "V" according to the voltage at the one end of the first resistor "R1" and the voltage at the one end of the second resistor "R2".

The controlling circuit 102 having the configuration described above is a replica circuit of the delay circuit (FIG. 8). The controlling voltage "V" that provides a desired delay time can be obtained by controlling the resistance of the variable resistor "ZR" of the controlling circuit 102 to be a desired value.

For example, the delay time is approximately in proportion to the on-resistance of the transistors, so that the controlling voltage can also be determined by using the replica circuit of the delay circuit (FIG. 8) and conducting a feedback control to set the on-resistances at desired values.

In FIG. 16, if the first and second resistors "R1" and "R2" have an equal resistance, the controlling voltage "V" is determined so that the variable resistor "ZR" and the reference resistor "Rr" have an equal resistance. If the resistance of the reference resistor "Rr" is binary-weighted, the delay time can also be substantially binary-weighted.

As described above, the time-to-digital converting circuit according to this embodiment has a reduced circuit size.

(Modification)

Although 4-bit conversion is performed in one clock cycle in the example shown in FIG. 1, the same conversion can also be performed in four clock cycles. In this case, the clock signal or the data signal can be selectively delayed depending on the result for the higher order bit as in the first embodiment, or only one of the clock signal and the data signal can be delayed or advanced.

Figure 17:
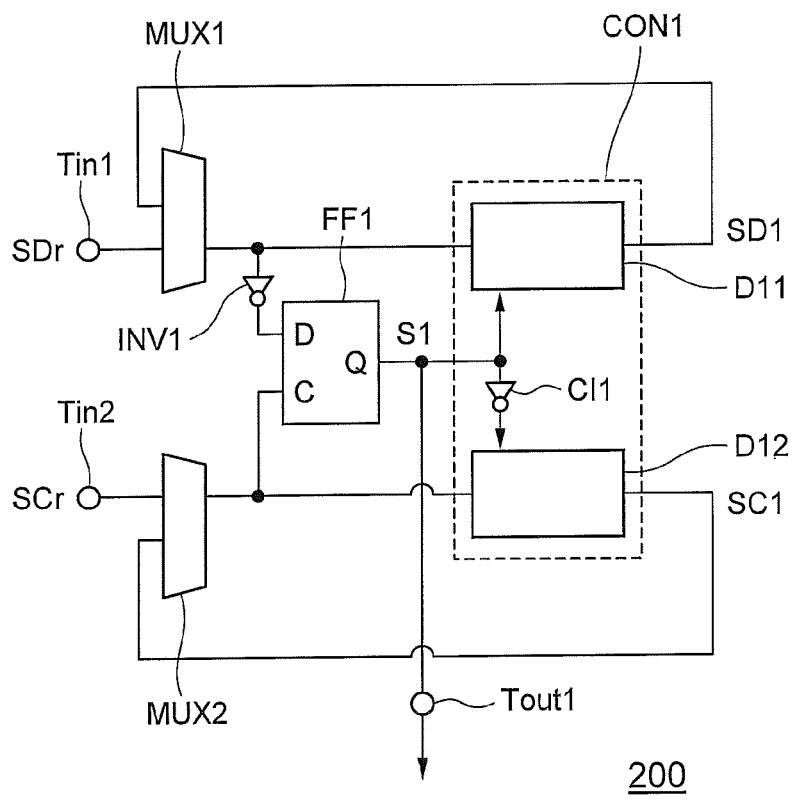
FIG. 17 is a diagram showing an example of a configuration of a time-to-digital converting circuit 200 according to a modification.

FIG. 17 is a diagram showing an example of a configuration of a time-to-digital converting circuit 200 according to a modification. In FIG. 17, the same reference symbols as those in FIG. 1 denote the same components as those in the first embodiment.

As shown in FIG. 17, the time-to-digital converting circuit 200 includes a first signal input terminal "Tin1", a second signal input terminal "Tin2", a first signal output terminal "Tout1", a first multiplexer "MUX1", a second multiplexer "MUX2", a first flip-flop "FF1", a first delay controlling circuit "CON1", and a first input inverter "INV1".

As with the time-to-digital converting circuit 100 shown in FIG. 1, the time-to-digital converting circuit 200 is configured to convert a time when the logic of a reference data signal "SDr" changes during a reference period into a digital value.

The first signal input terminal "Tin1" is configured to receive the reference data signal "SDr".

The second signal input terminal "Tin2" is configured to receive a reference clock signal "SCr" at a first point in time at the middle of the reference period.

The first signal output terminal "Tout1" is configured to serially output digital values.

The first input inverter "INV1" is connected to the first signal input terminal "Tin1" at an input thereof and to a data terminal "D" of the first flip-flop "FF1" at an output thereof.

The first multiplexer "MUX1" is connected to the first signal input terminal "Tin1" at an input thereof.

The second multiplexer "MUX2" is connected to the second signal input terminal "Tin2" at an input thereof.

The first flip-flop "FF1" has the data terminal "D" to which a signal based on a signal output from the first multiplexer "MUX1" (a signal output from the first input inverter "INV1") is input, a clock terminal "C" to which a signal output from the second multiplexer "MUX2" is input, and an output terminal "Q" that is connected to the first signal output terminal "Tout1" and from which a first output signal "S1" is output.

The first delay controlling circuit "CON1" is configured to output a first data signal "SD1" obtained by controlling the delay time of the signal output from the first multiplexer "MUX1" based on the first output signal "S1". The first delay controlling circuit "CON1" is further configured to output a first clock signal "SC1" obtained by controlling the delay time of the signal output from the second multiplexer "MUX2" based on the first output signal "S1".

The first multiplexer "MUX1" receives the reference data signal "SDr" and the first data signal "SD1", selects and outputs the reference data signal "SDr", and then selects and outputs the first data signal "SD1".

Similarly, the second multiplexer "MUX2" receives the reference clock signal "SCr" and the first clock signal "SC1", selects and outputs the reference clock signal "SCr", and then selects and outputs the first clock signal "SC1".

Then, the first and second multiplexers "MUX1" and "MUX2" repeat the operation of selecting and outputting the signals output from the first delay controlling circuit "CON1".

In this way, digital values are serially output in descending order of bit significance from the first signal output terminal "Tout1" in four clock cycles.

Second Embodiment

In the first embodiment, time-to-digital converting circuits have been described.

In a second embodiment, a digital-to-time converting circuit to which the technique according to the first embodiment described above is applied will be described.

Figure 18:
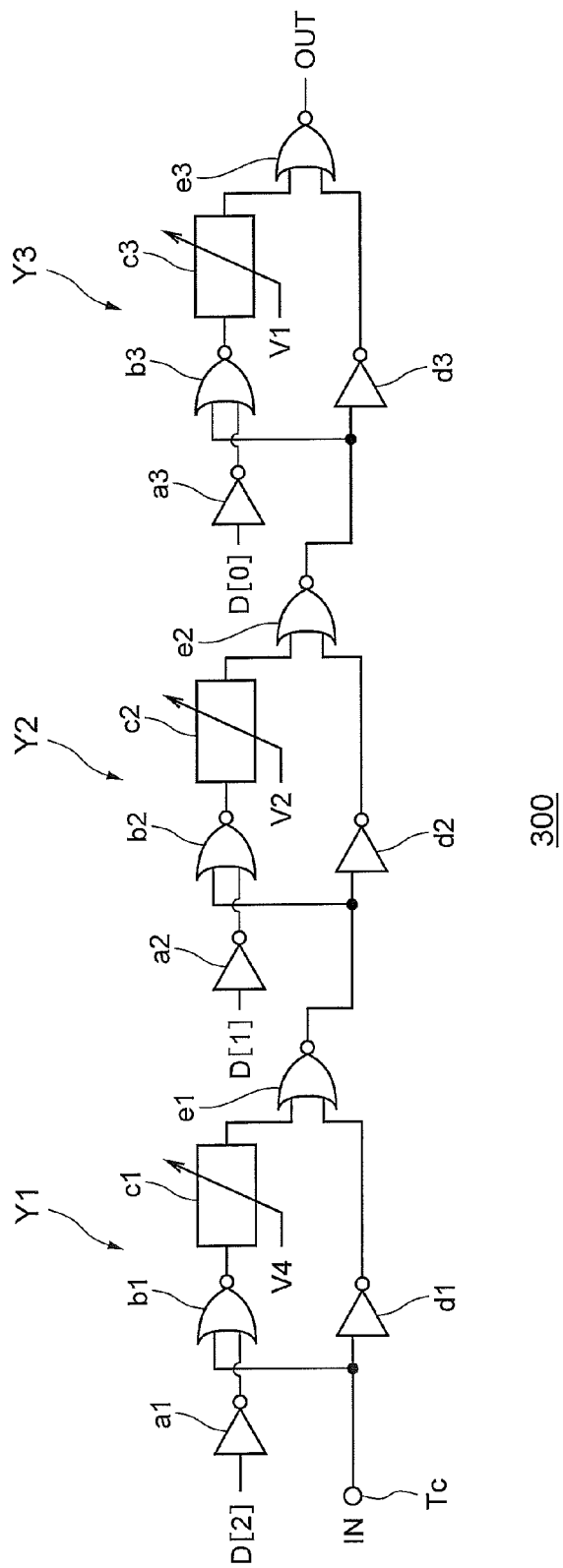
FIG. 18 is a diagram showing an example of a configuration of a digital-to-time converting circuit 300 according to the second embodiment.
Figure 19:
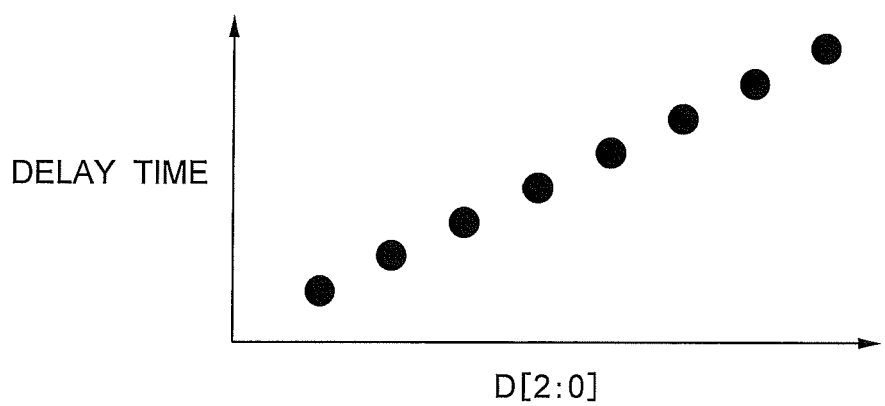
FIG. 19 is a graph showing a relationship between first to third digital values "D[2:0]" and a delay time of the digital-to-time converting circuit 300.

FIG. 18 is a diagram showing an example of a configuration of a digital-to-time converting circuit 300 according to the second embodiment. FIG. 19 is a graph showing a relationship between first to third digital values "D[2:0]" and a delay time of the digital-to-time converting circuit 300. FIG. 18 shows a configuration that converts a 3-bit digital value into a time, as an example.

As shown in FIG. 18, the digital-to-time converting circuit 300 includes three, first to third, delay switching circuits "Y1" to "Y3" connected in series with each other.

The first delay switching circuit "Y1" has the same configuration as the second delay switching circuit "D12" shown in FIG. 3 described above.

Specifically, the first delay switching circuit "Y1" has a first inverter "a1" to which the first digital value "D[2]" is input, a first NOR circuit "b1" connected to a clock input terminal "Tc" and an output of the first inverter "a1" at inputs thereof, a first delay circuit "c1" that is connected to the first NOR circuit "b1" at an input thereof, delays a signal input from the first NOR circuit "b1" by a first delay time and outputs the delayed signal, a second inverter "d1" connected to the clock input terminal "Tc" at an input thereof, and a second NOR circuit "e1" connected to an output of the first delay circuit "c1" and an output of the second inverter "d1" at inputs thereof.

The second delay switching circuit "Y2" has the same configuration as the second delay switching circuit "D22" shown in FIG. 5 described above.

Specifically, the second delay switching circuit "Y2" has a third inverter "a2" to which the second digital value "D[1]", which is of a lower order than the first digital value "D[2]", is input, a third NOR circuit "b2" connected to an output of the second NOR circuit "e1" and an output of the third inverter "a2" at inputs thereof, a second delay circuit "c2" that is connected to the third NOR circuit "b2" at an input thereof, delays a signal input from the third NOR circuit "b2" by a second delay time and outputs the delayed signal, a fourth inverter "d2" connected to the output of the second NOR circuit "e1" at an input thereof, and a fourth NOR circuit "e2" connected to an output of the second delay circuit "c2" and an output of the fourth inverter "d2" at inputs thereof.

The third delay switching circuit "Y3" has the same configuration as the second delay switching circuit "D32" shown in FIG. 5 described above.

Specifically, the third delay switching circuit "Y3" has a fifth inverter "a3" to which the third digital value "D[0]", which is of a lower order than the second digital value "D[1]", is input, a fifth NOR circuit "b3" connected to an output of the fourth NOR circuit "e2" and an output of the fifth inverter "a3" at inputs thereof, a third delay circuit "c3" that is connected to the fifth NOR circuit "b3" at an input thereof, delays a signal input from the fifth NOR circuit "b3" by a third delay time and outputs the delayed signal, a sixth inverter "d3" connected to the output of the fourth NOR circuit "e2" at an input thereof, and a sixth NOR circuit "e3" connected to an output of the third delay circuit "c3" and an output of the sixth inverter "d3" at inputs thereof.

A signal output from the output of the sixth NOR circuit "e3" is a data signal. The time of a transition of the logic of the data signal depends on the delay time determined by the first to third digital values "D[2:0]" (see FIG. 19).

The first delay time is set to be twice as long as the second delay time, for example. The second delay time is set to be twice as long as the third delay time.

The first to third delay times are controlled by changing controlling voltages "V4", "V2" and "V1" supplied to the first to third delay circuits "c1" to "c3". A method of controlling the controlling voltages "V4", "V2" and "V1" is implemented by the circuits configured as shown in FIGS. 8, 10 and 11 described above, for example. The controlling voltages "V4", "V2" and "V1" can be controlled by the controlling circuit 101 shown in FIG. 15, for example.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A time-to-digital converting circuit that converts a time when a logic of a reference data signal changes in a reference period into a digital value, comprising:
   a first signal input terminal to which a reference data signal is input;
   a second signal input terminal to which a reference clock signal is input at a first point in time in the reference period;
   a first signal output terminal from which a first digital value, which is the most significant bit, is output;
   a second signal output terminal from which a second digital value, which is of a lower order than the first digital value, is output;
   a first flip-flop having a data terminal to which a signal based on the reference data signal input to the first signal input terminal is input, a clock terminal to which the reference clock signal input to the second signal input terminal is input, and an output terminal that is connected to the first signal output terminal and from which a first output signal is output;
   a first delay controlling circuit that outputs a first data signal obtained by controlling a delay time of the reference data signal input thereto via the first signal input terminal based on the first output signal and a first clock signal obtained by controlling a delay time of the reference clock signal input thereto via the second signal input terminal based on the first output signal; and
   a second flip-flop having a data terminal to which a signal based on the first data signal is input, a clock terminal to which the first clock signal is input, and an output terminal that is connected to the second signal output terminal and from which a second output signal is output;
   wherein the first delay controlling circuit:
   controls the delay time of the reference clock signal to be shorter than the delay time of the reference data signal if the logic of the reference data signal changes before or at the first point in time; and
   controls the delay time of the reference clock signal to be longer than the delay time of the reference data signal if the logic of the reference data signal changes after the first point in time.

2. The time-to-digital converting circuit according to claim 1, wherein a first delay time, which is a difference between the delay time of the reference data signal and the delay time of the reference clock signal, is set at a quarter of the reference period.

3. The time-to-digital converting circuit according to claim 1, wherein the first delay controlling circuit comprises:
   a first delay switching circuit that is configured to output the first data signal obtained by controlling the delay time of the reference data signal input thereto via the first signal input terminal, based on the first output signal; and
   a second delay switching circuit that is configured to output the first clock signal obtained by controlling the delay time of the reference clock signal input thereto via the second signal input terminal, based on the first output signal.

4. The time-to-digital converting circuit according to claim 3, wherein the first delay controlling circuit further comprises:
   a controlling inverter that is connected to the output terminal of the first flip-flop at an input thereof and is configured to output a signal obtained by inverting the first output signal,
   wherein the first delay switching circuit comprises:
     a first inverter that is connected to the output terminal of the first flip-flop at an input thereof;
     a first NOR circuit that is connected to the first signal input terminal and an output of the first inverter at inputs thereof;
     a first delay circuit that is connected to an output of the first NOR circuit at an input thereof and is configured to delay the signal input from the first NOR circuit by a first delay time and output the delayed signal;
     a second inverter that is connected to the first signal input terminal at an input thereof; and
     a second NOR circuit that is connected to an output of the first delay circuit and an output of the second inverter at inputs thereof and is configured to output the first data signal at an output thereof, and
   wherein the second delay switching circuit comprises:
     a third inverter that is connected to an output of the controlling inverter at an input thereof;
     a third NOR circuit that is connected to the second signal input terminal and an output of the third inverter at inputs thereof;
     a second delay circuit that is connected to an output of the third NOR circuit at an input thereof and is configured to delay the signal input from the second NOR circuit by the first delay time and output the delayed signal;
     a fourth inverter that is connected to the second signal input terminal at an input thereof; and
     a fourth NOR circuit that is connected to an output of the second delay circuit and an output of the fourth inverter at inputs thereof and is configured to output the first clock signal at an output thereof.

5. The time-to-digital converting circuit according to claim 1, further comprising a first input inverter that is connected to the first signal input terminal at an input thereof and is connected to a data terminal of the first flip-flop at an output thereof.

6. The time-to-digital converting circuit according to claim 4, wherein the first delay circuit comprises:
   a first delay inverter that is input to the input of the first delay circuit at an input thereof;
   a second delay inverter that is connected to an output of the first delay inverter at an input thereof and to the output of the first delay circuit at an output thereof; and
   a variable capacitor that is connected between the output of the first delay inverter and the ground and is configured to change a capacitance depending on the controlling voltage.

7. The time-to-digital converting circuit according to claim 4, wherein the first delay circuit comprises:
   a first delay inverter that is input to the input of the first delay circuit at an input thereof; and
   a second delay inverter that is connected to an output of the first delay inverter at an input thereof and to the output of the first delay circuit at an output thereof, and
   wherein a power supply voltage supplied to the first and second delay inverters is controlled.

8. The time-to-digital converting circuit according to claim 4, wherein the first delay circuit comprises:
  a first pMOS transistor that is connected to a power supply at the source thereof and to an output of the first delay circuit at the drain thereof;
  a first nMOS transistor that is connected to the output of the first delay circuit at the drain thereof, to the ground at the source thereof and to a gate of the first pMOS transistor at the gate thereof;
  a second pMOS transistor that is connected between the power supply and the gate of the first pMOS transistor and is connected to the input of the first delay circuit at the gate thereof;
  a second nMOS transistor that is connected between the gate of the first pMOS transistor and the ground and is connected to the input of the first delay circuit at the gate thereof; and
  a variable resistor that is connected in series with the second pMOS transistor and the second nMOS transistor between the power supply and the ground.

9. The time-to-digital converting circuit according to claim 8, wherein the variable resistor is a MOS transistor to a gate of which a controlling voltage is applied.

10. The time-to-digital converting circuit according to claim 1, further comprising:
  a third signal output terminal at which a third digital value, which is of a lower order than the second digital value, is output;
  a second delay controlling circuit that receives the first data signal and the first clock signal, outputs a second data signal obtained by controlling a delay time of the first data signal based on the second output signal, and outputs a second clock signal obtained by controlling a delay time of the first clock signal based on the second output signal; and
  a third flip-flop having a data terminal to which the second data signal is input, a clock terminal to which the second clock signal is input, and an output terminal that is connected to the third signal output terminal and from which a third output signal is output.

11. The time-to-digital converting circuit according to claim 10, wherein a first delay time of the first delay controlling circuit, which is a difference between the delay time of the reference data signal and the delay time of the clock signal, is twice as long as a second delay time of the second delay controlling circuit, which is a difference between the delay time of the first data signal and the delay time of the first clock signal.

12. A time-to-digital converting circuit that converts a time when a logic of a reference data signal changes in a reference period into a digital value, comprising:
  a first signal input terminal that is configured to receive the reference data signal;
  a second signal input terminal that is configured to receive a reference clock signal at a first point in time at a middle of the reference period;
  a first signal output terminal that is configured to output digital values;
  a first multiplexer that is connected to the first signal input terminal at an input thereof;
  a second multiplexer that is connected to the second signal input terminal at an input thereof;
  a first flip-flop having a data terminal to which a signal based on a signal output from the first multiplexer is input, a clock terminal to which a signal output from the second multiplexer is input, and an output terminal that is connected to the first signal output terminal and from which a first output signal is output; and
  a first delay controlling circuit that is configured to output a first data signal obtained by controlling a delay time of a signal output from the first multiplexer based on the first output signal, and is configured to output a first clock signal obtained by controlling a delay time of a signal output from the second multiplexer based on the first output signal,
  wherein the first multiplexer receives the reference data signal and the first data signal, selects and outputs the reference data signal, and then selects and outputs the first data signal, and
  wherein the second multiplexer receives the reference clock signal and the first clock signal, selects and outputs the reference clock signal, and then selects and outputs the first clock signal.

13. A digital-to-time converting circuit, comprising:
  a first inverter to which a first digital value is input;
  a first NOR circuit connected to an input terminal to which a signal is input and an output of the first inverter at inputs thereof;
  a first delay circuit that is connected to the first NOR circuit at an input thereof, delays a signal input from the first NOR circuit by a first delay time, and outputs the delayed signal;
  a second inverter connected to a clock input terminal at an input thereof;
  a second NOR circuit connected to an output of the first delay circuit and an output of the second inverter at inputs thereof;
  a third inverter to which a second digital value is input;
  a third NOR circuit connected to an output of the second NOR circuit and an output of the third inverter at inputs thereof;
  a second delay circuit that is connected to the third NOR circuit at an input thereof, delays a signal input from the third NOR circuit by a second delay time, and outputs the delayed signal;
  a fourth inverter connected to the output of the second NOR circuit at an input thereof; and
  a fourth NOR circuit connected to an output of the second delay circuit and an output of the fourth inverter at inputs thereof.

* * * * *